(12) United States Patent
Shiba et al.

(10) Patent No.: US 8,148,229 B2
(45) Date of Patent: Apr. 3, 2012

(54) METHOD FOR MANUFACTURING A SEMICONDUCTOR LIGHT-RECEIVING DEVICE

(75) Inventors: Kazuhiro Shiba, Tokyo (JP); Kikuo Makita, Tokyo (JP); Takeshi Nakata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/839,649

(22) Filed: Jul. 20, 2010

(65) Prior Publication Data

US 2010/0279457 A1    Nov. 4, 2010

Related U.S. Application Data

(62) Division of application No. 11/815,003, filed as application No. PCT/JP2005/023012 on Dec. 15, 2005, now abandoned.

(30) Foreign Application Priority Data

Jan. 28, 2005    (JP) .................................. 2005-022077

(51) Int. Cl.
*H01L 31/18*    (2006.01)

(52) U.S. Cl. .......... 438/380; 438/91; 438/758; 438/761; 438/778; 438/781

(58) Field of Classification Search .................. 257/184, 257/186; 438/57, 71, 91, 93, 94, 380, 758, 438/761, 778, 781, 787, 791
See application file for complete search history.

(56) References Cited

U.S. PATENT DOCUMENTS

| | | | | |
|---|---|---|---|---|
| 4,215,358 A | * | 7/1980 | Wataze et al. | 257/496 |
| 5,308,995 A | * | 5/1994 | Tsuji et al. | 257/17 |
| 5,552,629 A | | 9/1996 | Watanabe | |
| 6,104,047 A | * | 8/2000 | Watanabe | 257/186 |
| 6,117,702 A | * | 9/2000 | Nakamura et al. | 438/57 |
| 6,127,238 A | * | 10/2000 | Liao et al. | 438/382 |
| 6,350,998 B1 | * | 2/2002 | Tsuji | 257/186 |

(Continued)

FOREIGN PATENT DOCUMENTS

JP    3-276723    12/1991

(Continued)

OTHER PUBLICATIONS

Isao Watanabe, et al., "High-Speed, High-Reliability Planar-Structure Superlattice Avalanche Photodiodes for 10-Gb/s Optical Receivers", *Journal of Lightwave Technology*, vol. 18, No. 12, pp. 220-2207, Dec. 2000.

(Continued)

*Primary Examiner* — Victor A Mandala
*Assistant Examiner* — William Harriston
(74) *Attorney, Agent, or Firm* — Sughrue Mion, PLLC

(57) ABSTRACT

Disclosed is a method for manufacturing a semiconductor light-receiving device having high reproducibility and reliability. Specifically disclosed is a semiconductor light-receiving device 100 with a mesa structure wherein a light-absorbing layer 6, an avalanche multiplication layer 4 and an electric-field relaxation layer 5 are formed on a semiconductor substrate 2. The light-absorbing layer 6, avalanche multiplication layer 4 and electric-field relaxation layer 5 exposed in the side wall of the mesa structure are protected by an $SiN_x$ film or an $SiO_yN_z$ film. The hydrogen concentration in the side wall surface of the electric-field relaxation layer 5 is set at not more than 15%, preferably not more than 10% of the carrier concentration of the electric-field relaxation layer 5.

13 Claims, 11 Drawing Sheets

U.S. PATENT DOCUMENTS

| | | | |
|---|---|---|---|
| 6,495,380 B2* | 12/2002 | Clark et al. | 438/22 |
| 6,635,908 B2* | 10/2003 | Tanaka et al. | 257/186 |
| 6,650,683 B2* | 11/2003 | Ueki et al. | 372/96 |
| 6,737,718 B2 | 5/2004 | Takeuchi | 257/431 |
| 6,740,861 B2* | 5/2004 | Matsuda | 250/214.1 |
| 6,743,657 B2 | 6/2004 | Dries et al. | 438/91 |
| 6,791,124 B2* | 9/2004 | Hiraoka et al. | 257/186 |
| 6,936,868 B2* | 8/2005 | Hiraoka et al. | 257/186 |
| 6,963,089 B2* | 11/2005 | Shi et al. | 257/186 |
| 6,974,712 B2* | 12/2005 | Ouchi et al. | 438/29 |
| 7,020,173 B2* | 3/2006 | Yamamoto et al. | 372/45.01 |
| 7,020,375 B2* | 3/2006 | Nakaji et al. | 385/131 |
| 7,259,408 B2* | 8/2007 | Yagyu et al. | 257/186 |
| 7,259,439 B2* | 8/2007 | Nakajima | 257/466 |
| 7,348,608 B2* | 3/2008 | Ko et al. | 257/185 |
| 7,378,146 B1* | 5/2008 | Hedrick et al. | 428/216 |
| 7,622,785 B2* | 11/2009 | Sasagawa et al. | 257/432 |
| 7,838,444 B2 | 11/2010 | Oguri | 438/792 |
| 7,892,602 B2 | 2/2011 | Chung et al. | 427/255.391 |
| 7,902,089 B2 | 3/2011 | Matsumoto et al. | 438/791 |
| 7,995,636 B2 | 8/2011 | Murakami et al. | 372/50.124 |
| 8,008,688 B2 | 8/2011 | Hu | 257/186 |
| 2002/0088992 A1* | 7/2002 | Takeuchi | 257/184 |
| 2002/0185702 A1* | 12/2002 | Shirai et al. | 257/443 |
| 2003/0039294 A1* | 2/2003 | Ueki et al. | 372/96 |
| 2004/0000675 A1* | 1/2004 | Kamiyama et al. | 257/184 |
| 2004/0106265 A1* | 6/2004 | Vickers | 438/380 |
| 2004/0151221 A1* | 8/2004 | Yamamoto et al. | 372/32 |
| 2005/0006678 A1* | 1/2005 | Tanaka et al. | 257/292 |
| 2005/0025443 A1* | 2/2005 | Nakaji et al. | 385/131 |
| 2005/0051861 A1* | 3/2005 | Shi et al. | 257/438 |
| 2005/0056862 A1* | 3/2005 | Park | 257/184 |
| 2005/0074973 A1* | 4/2005 | Ouchi et al. | 438/689 |
| 2005/0221628 A1* | 10/2005 | Tanaka et al. | 438/791 |
| 2005/0233484 A1* | 10/2005 | Stein et al. | 438/22 |
| 2006/0157714 A1* | 7/2006 | Yoo et al. | 257/79 |
| 2006/0231852 A1* | 10/2006 | Kususe et al. | 257/99 |
| 2007/0014324 A1* | 1/2007 | Maeda et al. | 372/46.01 |
| 2008/0251808 A1* | 10/2008 | Kususe et al. | 257/98 |
| 2008/0290369 A1* | 11/2008 | Yagyu et al. | 257/186 |
| 2009/0050933 A1* | 2/2009 | Shiba et al. | 257/186 |
| 2010/0279457 A1* | 11/2010 | Shiba et al. | 438/91 |

FOREIGN PATENT DOCUMENTS

| | | |
|---|---|---|
| JP | 4-311071 | 11/1992 |
| JP | 5-259499 | 10/1993 |
| JP | 7-312442 | 11/1995 |
| JP | 63-132434 | 6/1998 |
| JP | 2000-22197 | 1/2000 |

OTHER PUBLICATIONS

Monday Afternoon, OFC2003, vol. 1, 67, pp. 67-68.

* cited by examiner

METHOD FOR MANUFACTURING A SEMICONDUCTOR LIGHT-RECEIVING DEVICE

CROSS-REFERENCE TO RELATED APPLICATION

This application is a Divisional of U.S. Application No. 11/815,003, filed Jul. 27, 2007 (now abandoned); which is a 371 of PCT/JP2005/023012, filed Dec. 15, 2005; which claims priority from Japanese Application No. 2005-022077, filed Jan. 28, 2005. The entire disclosures of the prior applications are considered part of the disclosure of the present Application, and are hereby incorporated herein by reference.

TECHNICAL FIELD

The present invention relates to a semiconductor light-receiving device used in an optical communication for example and a method for manufacturing the same.

BACKGROUND ART

In recent years, as a semiconductor light-receiving device for optical fiber communication, several types of semiconductor light-receiving devices are proposed. Especially, a mesa structure semiconductor light-receiving device is attracting attentions. The reason is that it can be produced in mass by simple processes with low cost. And it could also reduce a parasitic capacitance in order to achieve high-speed.

FIG. 10 shows a schematic diagram of a semiconductor light-receiving device having a mesa structure. As shown in FIG. 10, in a semiconductor light-receiving device 900 with a mesa structure, an n electrode 901 is provided at the rear surface of a substrate 902, and a mesa structure is adopted at the light incident side of the substrate 902. And inside of it, an n type cladding layer 903, absorbing layer 904 and p type cladding layer 905 are laminated. Furthermore, over the light incident surface of the p type cladding layer 905, a p electrode 906 is provided. As described above, for the semiconductor light-receiving device with a mesa structure, as a pn junction excluding a light-absorbing unit is etched, a pad electrode capacitance on p side can be reduced. This is an advantage as a light-receiving device used for telecommunications sector for high-speed response.

Moreover, as a semiconductor light-receiving device, there is an Avalanche Photo diode (APD) having a structure with a signal amplifying function inside the device in light of improving sensitivity. FIG. 11 shows a basic structure of a mesa APD. As shown in FIG. 11, an APD 910 adopts a mesa structure on a light incident side of a substrate 912. And an n type cladding layer 913, avalanche multiplication layer 914, electric-field relaxation layer 915, absorbing layer 916, p type cladding layer 917 and p type contact layer 918 are laminated. On a sidewall of the laminated layer, a lateral protection film 919 is formed. Furthermore, to the incident surface of an input light, a p electrode 920 is formed.

As for the absorbing layer 916, a semiconductor material capable of sufficiently absorbing an incident light is selected. And especially for communication, InGaAs is adopted which maintains a high absorption coefficient on shorter wavelength side than the wavelength 1.60 µm. As for the multiplication layer 914, a wide gap material is selected which is able to suppress a leak current even in a high electric field as it speeds up and multiplies the injected carrier. Especially for communication, InAlAs or InP is adopted.

In the APD 910, an electron or positive hole (first carrier) generated by absorbing a light in the absorbing layer 916 is accelerated by an electric field inside the absorbing layer 916 of the APD, which is generated by applying a reverse bias. The first carrier is injected into the avalanche multiplication layer 914 while holding kinetic energy and collides with a neutral atom inside the avalanche multiplication layer 914. As a result, an electron and positive hole (second carrier) are generated. Moreover, the first carrier and second carrier are accelerated by the electric field and by colliding to a neutral atom, a new carrier is generated. By the process consecutively occurring, the generated electron and positive hole are expotentially increased, that is, multiplied. By this, the APD is able to sense a small signal as compared to a normal photodiode.

Considering an APD used in an optical communication band, a InGaAs layer and InAlAs multiplication layer which are lattice matched over an InP substrate are the basic structure. When applying a reverse bias to the pn junction, an internal electric field distribution at an operation of the APD is shown in FIG. 12. An electric field of each layer is controlled by the doping concentration distribution among the multiplication layer, electric-field layer and absorbing layer. The vertical axis of FIG. 12 is an electric field E.

An important point to operate the APD successfully is to control each of the electric fields in the absorbing layer and multiplication layer. For example for the APD used in the abovementioned optical communication band, an electric field of the InGaAs absorbing layer must be controlled from 50 to 150 kV/cm, an electric field of the multiplication layer must be controlled to 600 kV/cm or more. The InGaAs constituting the absorbing layer has a narrow gap and its band gap energy is 0.75 eV. Thus in an electric field of 150 kV/cm or more, a noise caused by a tunneling current is generated, causing a sensitivity deterioration. Moreover, a high electric field more than necessary is not preferable in light of reliability. Because the electron or positive hole generated in the absorbing layer is not accelerated enough in not more than 50 kV/cm, an energy barrier with the adjacent semiconductor layer cannot be overcome by drift running, thus a problem is generated in terms of high-speed response characteristics or the like.

On the other hand in the multiplication layer, the carrier injected into the multiplication layer is accelerated by applying a high electric field and collides with lattice to generate a new pair of electron-positive hole. A signal is amplified by this process repeatedly occurring in the multiplication layer, however to occur the process consecutively, an electric field of 600 kV/cm or more is required.

As in the abovementioned example, the most important thing in the APD is to control the electric fields of the avalanche multiplication layer and absorbing layer. In order to make the APD operate properly, optimum electric fields are required for the absorbing and multiplication layers. The control of the electric field distribution is performed by controlling the layer thickness of the electric-field relaxation layer held between the avalanche multiplication and absorbing layer and carrier concentration. That is, controlling the width of the electric-field relaxation layer and carrier concentration is an important key to the reliability and characteristics of the APD.

In order to achieve an APD having a high reliability in a conventional method, a planar structure or pseudo planar structure is adopted for controlling the electric field using an ion implantation and diffusion technique or the like for the abovementioned layer structure to form a pn electrode over a crystal surface (for example non-patent document 1). This method surrounds the multiplication layer, electric-field relaxation layer and absorbing layer with InP implanted with Be ion so as to avoid exposing the multiplication layer portion where a high electric field is applied. Such structure is referred to as a guard ring structure.

Furthermore, in the APD having a planar structure, the periphery of the guard ring structure is protected with a $SiN_x$ film. However for the APD having these structures, there are problems that the manufacturing method is generally complicated. And it is difficult to improve characteristics of the device and a tolerance of manufacturing condition.

On the other hand, as a mesa semiconductor light-receiving device, a pn structure is formed in growth process to form a light-receiving area by a mesa etching, and an electric field distribution is distributed one-dimensionally, so the device design is easy. Thus it has advantages of a higher degree of freedom, easier to improve device characteristics and improve manufacturing yield as compared with the abovementioned planar type. However a device that achieved sufficient reliability has not developed yet, because a high electric field is applied to the absorbing layer and avalanche multiplication layer and in addition these layers are exposed to the surface.

Next, characteristics of a device are considered from device fabrication. In the mesa semiconductor light-receiving device, as shown in FIG. 11, the sidewalls of the multiplication layer 914 and field electric relaxation layer 915 which are applied with a high electric field and the absorbing layer 916 that is narrow gap and likely to generate a tunneling current are exposed. In light of device reliability, it is important to protect the lateral faces of these layers.

As a conventional method, a method for obtaining a protection film with a $SiN_x$ film created by a plasma CVD (Chemical Vapor Deposition) method or a method for protecting with polyimide and BCB or the like are suggested. However in these protection films, there is a problem in stability of the semiconductor and interface. Furthermore, for the polyimide and BCB or the like, there is also a problem in hygroscopicity. Therefore, as for the APD constituted of a mesa structure, it has been difficult to achieve a high reliability of more than million hours in an operation of the APD at 85 degrees.

In a normal mesa type photodiode, a $SiN_x$ film created by a plasma CVD is used as a protection film. The abovementioned $SiN_x$ protection film is manufactured by a plasma CVD using $SiH_4$ and $NH_3$ as materials. This method has extremely simple processes and is advantageous in terms of reproducibility and process cost.

However when applying the abovementioned method to the APD, hydrogen radicals diffuse into the APD which are generated by the decomposition of the $NH_3$. Especially for the hydrogen diffused in the electric-field relaxation layer, the hydrogen radical stably bonds with main components of the electric-field relaxation layer in the vicinity of an impurity, and the impurity becomes into a state not satisfactory functioning as an acceptor. And after a passivation, the carrier concentration of the electric-field relaxation layer changes especially near the sidewall.

This increases a leak current of the side wall thus it is not a preferable method in light of device characteristics and reliability. Furthermore as described above, the carrier concentration of the electric-field relaxation layer is a key to the reliability of the APD and if the carrier concentration changes, it brings a cause to deteriorate the reliability of the APD. However it is extremely difficult to control the amount of diffusion of the hydrogen radical during the process, thus it is difficult to improve reproducibility and reliability. This has been a problem for structure and manufacture in a mesa APD.

As a method for preventing the influence by the diffusion of the abovementioned hydrogen radical, as a conventional technique, there is a method (for example non-patent document 2) for not etching the multiplication layer to remain, laminating InP doped with Fe in the etched portion (guard ring) and protecting its surface with a $SiN_x$ film. Even in this method, as with the abovementioned non-patent document 1, the manufacturing process is extremely complicated and it is difficult to improve device characteristics and yield.

[Non-Patent Document 1]
Isao Watanabe, Takeshi Nakata, Masayoshi Tsuji, Kikuo Makita, Toshitaka Torikai, and Kencho Taguchi, J. Lightwave Technol., vol. 18, p. 2200-2207, December 2000.

[Non-Patent Document 2]
S. Tanaka, S. Fujiki, T. tsuchiya, S. Tsuji, Monday Afternoon, OFC2003, vol. 1, 67

DISCLOSURE OF THE INVENTION

Problems to be Solved by the Invention

As described above, in a conventional method, it was not possible to protect the sidewall of the mesa APD and create the one with high reliability and reproducibility. Furthermore in a conventional method for covering the lateral face of the APD with a $SiN_x$ film, the influence of the hydrogen passivation has not been removed.

Means for Solving the Problems

According to an aspect of the present invention, there is provided a semiconductor light-receiving device having a mesa structure constituted of a semiconductor layer including a light absorbing layer, an avalanche multiplication layer and an electric-field relaxation layer over a semiconductor substrate includes a $SiN_x$ film or a $SiO_yN_z$ film for protecting lateral faces of the light absorbing layer, the avalanche multiplication layer and the electric-field relaxation layer in the mesa structure, where a hydrogen concentration at least in a part of the light absorbing layer, the avalanche multiplication layer and electric-field relaxation layer is not more than 15% of a carrier concentration in the electric-field relaxation layer. With the hydrogen concentration within the above range, even if the carrier concentration in the electric-field relaxation layer changes, the electric field in the light absorbing layer and avalanche multiplication layer can be within a required range.

According to another aspect of the present invention, there is provided a manufacturing method of a mesa semiconductor light-receiving device including a light absorbing layer, an avalanche multiplication layer and an electric-field relaxation layer over a semiconductor substrate, the method includes forming a mesa semiconductor structure and forming a $SiN_x$ film or $SiO_yN_z$ film using at least $N_2$ gas as a nitrogen source to a lateral face of the mesa semiconductor structure. By protecting the lateral faces of the multiplication layer and electric-field relaxation layer which are applied with a high electric field and the absorbing layer that is likely to generate a tunneling current and is narrow gap with the $SiN_x$ film or $SiO_yN_z$ film, a device with high reliability can be obtained.

Especially, the manufacturing method of a semiconductor light-receiving device according to the present invention, in a formation process of the $SiN_x$ film or $SiO_yN_z$ film, the $SiN_x$ film or $SiO_yN_z$ film is formed using at least $N_2$ gas as a nitrogen source. By using $N_2$ gas as a nitrogen source, it is possible to suppress from generating radical hydrogen to minimum, thus the amount of hydrogen diffused in the APD can be suppressed.

Furthermore, according to another aspect of the present invention, there is provided a manufacturing method of a mesa semiconductor light-receiving device including a light absorbing layer, an avalanche multiplication layer and an electric-field relaxation layer over a semiconductor substrate, the method includes forming a mesa semiconductor structure, forming a $SiN_x$ film or a $SiO_yN_z$ film and performing a heat treatment in inert gas atmosphere at 450 degrees Celsius or more and 700 degrees Celsius or less. By using the above heat treatment, the radical hydrogen included in the APD is discharged outside the APD and the hydrogen concentration in the APD can be suppressed.

Advantages of the Invention

According to the present invention, it is possible to provide an APD with high reproducibility and reliability and a manufacturing method for the APD.

Figure 1:
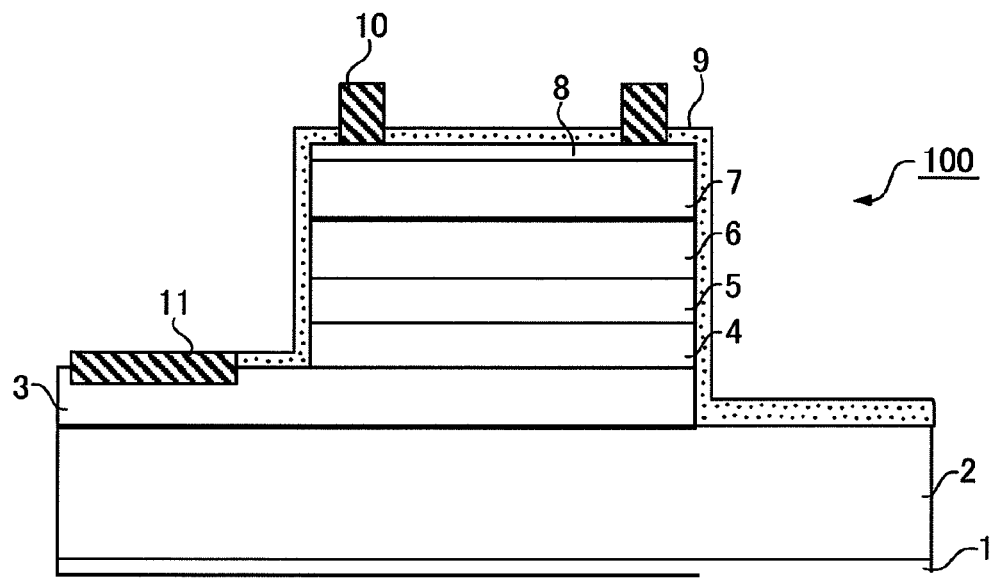
FIG. 1 is a cross-sectional diagram showing the structure of an avalanche light-receiving device according to the present invention.

| Description of Reference Numerals | |
|---|---|
| 1 | ELECTRODE |
| 2 | SUBSTRATE |
| 3 | CLADDING LAYER |
| 4 | MULTIPLICATION LAYER |
| 5 | ELECTRIC-FIELD RELAXATION LAYER |
| 6 | ABSORBING LAYER |
| 7 | CLADDING LAYER |
| 8 | CONTACT LAYER |
| 9 | SURFACE PROTECTION FILM |
| 10 | p ELECTRODE |
| 11 | n ELECTRODE |

| -continued | |
|---|---|
| Description of Reference Numerals | |
| 21 | n ELECTRODE |
| 22 | InP SUBSTRATE |
| 23 | n TYPE InP CLADDING LAYER |
| 24 | InAlAs MULTIPLICATION LAYER |
| 25 | p TYPE InAlAs ELECTRIC-FIELD RELAXATION LAYER |
| 26 | InGaAs ABSORBING LAYER |
| 27 | p TYPE InP CLADDING LAYER |
| 28 | p TYPE InP CONTACT LAYER |
| 29 | $SiN_x$ FILM OR $SiO_yN_z$ FILM |
| 30 | p ELECTRODE |
| 31 | n ELECTRODE |
| 41 | InP INSULATING SUBSTRATE |
| 42 | n TYPE InP BUFFER LAYER |
| 43 | n TYPE InGaAsP GUIDE LAYER |
| 44 | InAlAs MULTIPLICATION LAYER |
| 45 | InAlAs ELECTRIC-FIELD RELAXATION LAYER |
| 46 | InGaAs ABSORBING LAYER |
| 47 | p TYPE InGaAsP GUIDE LAYER |
| 48 | p TYPE InP CLADDING LAYER |
| 49 | p TYPE InGaAs CONTACT LAYER |
| 50 | $SiN_x$ PROTECTION FILM |
| 51 | p ELECTRODE |
| 52 | ANTIREFLECTIVE FILM |
| 53 | n ELECTRODE |
| 54 | p TYPE PAD ELECTRODE |
| 55 | BUMP REALIZATION POLYIMIDE LAYER |
| 901 | n ELECTRODE |
| 902 | InP SUBSTRATE |
| 903 | n TYPE InP GUIDE LAYER |
| 904 | InGaAs ABSORBING LAYER |
| 905 | p TYPE InP GUIDE LAYER |
| 906 | p ELECTRODE |
| 911 | n ELECTRODE |
| 912 | SUBSTRATE |
| 913 | n TYPE GUIDE LAYER |
| 914 | AVALANCHE MULTIPLICATION LAYER |
| 915 | ELECTRIC RELAXATION LAYER |
| 916 | ABSORBING LAYER |
| 917 | p TYPE GUIDE LAYER |
| 918 | p ELECTRODE |
| 919 | LATERAL PROTECTION LAYER |
| 920 | p ELECTRODE |

BEST MODES FOR CARRYING OUT THE INVENTION

The structure of a mesa APD 100 according to an embodiment 1 of the present invention is described hereinafter with reference to FIG. 1. In the structure in this embodiment, an electrode 1 having an additional role of a reflector is formed to a semi-insulating substrate 2. The electrode 1 is formed to facilitate the implementation and is formed including metal with high reflectivity. Furthermore, the substrate side surface of the electrode 1 is mirror polished, a light not absorbed in an absorbing layer 6 and transmitted is reflected at the surface of the substrate side of the electrode 1 and can be transmitted to the absorbing layer 6.

Moreover, to the opposite side of the electrode 1, over the substrate 2, an n type cladding layer 3 is formed. Furthermore, a mesa structure is provided over the n type cladding layer 3. Furthermore inside the mesa structure, an avalanche multiplication layer 4, field electric relaxation layer 5, absorbing layer 6, cladding layer 7, p type contact layer 8 are formed and overlapped in this order from bottom. A p electrode 10 is formed above a part of the p type contact layer 8. Furthermore, the surface of the mesa type avalanche photodiode 100 is covered with a $SiN_x$ film or $SiO_yN_z$ film 9. For the absorbing layer 6, a semiconductor material having a high absorption rate of an input light is selected. For the multiplication layer 4, in order to accelerate the injected carrier to multiply by applying a high electric field, a wide gap material is selected which is capable of suppressing a tunneling current even in a high electric field.

Figure 2:
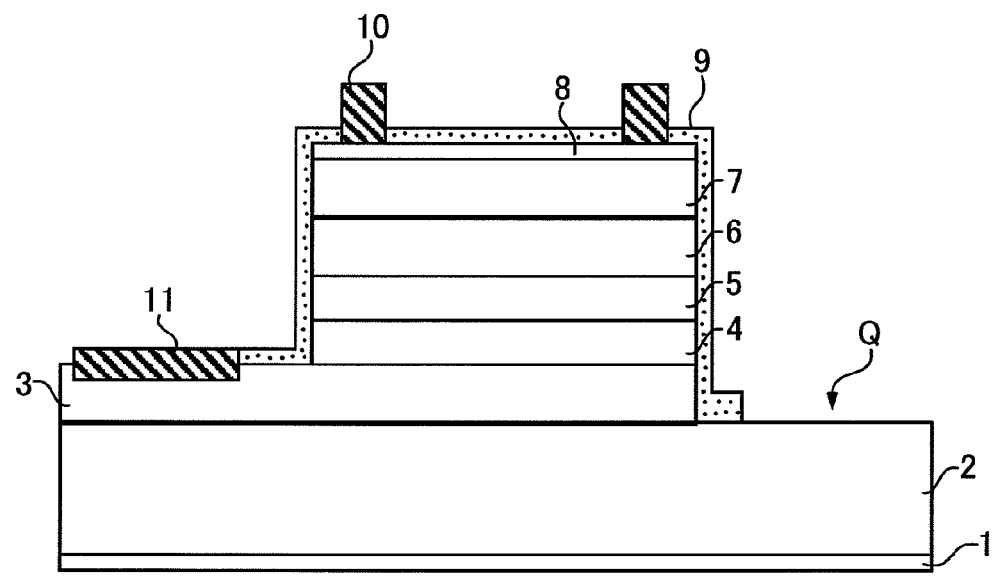
FIG. 2 is a view for explaining a conductivity evaluation unit in an avalanche light-receiving device according to the present invention.

The reason a part of the n type cladding layer 3 is removed here is, as shown in FIG. 2, to remove the $SiN_x$ film or $SiO_yN_z$ film 9 over the semi-insulating InP substrate 2 and to expose the surface of the semiconductor and to confirm the effect of the hydrogen passivation by checking surface electric conductivity. Thus the n type cladding layer 3 may exist all over the substrate 2. Moreover, the n type cladding layer 3 functions as an n side contact layer. An electrode 11 is formed over the n type cladding layer 3. In FIGS. 1 and 2, the n electrode 11 is formed over the n type cladding layer 3 but it is only an example and not limited to this position.

The APD 100 of this embodiment protects the lateral face of the avalanche multiplication layer 4, electric-field relaxation layer 5 and light-absorbing layer 6 with the $SiN_x$ film or $SiO_yN_z$ film 9. By this, it is possible to prevent from exposing the avalanche multiplication layer 4, electric-field relaxation layer 5 and absorbing layer 6 which are applied with a high electric field. Furthermore, at least a part of hydrogen concentration of the avalanche multiplication layer 4, electric-field relaxation layer 5 and light-absorbing layer 6 is suppressed to be not more than 15% of the carrier concentration doped in the field electric relaxation layer 5.

By adopting the abovementioned hydrogen concentration, as the carrier concentration of the electric-field relaxation layer 5 rarely changes, the electric fields of the avalanche multiplication layer 4 and light-absorbing layer 6 can be set to appropriate values, thus an APD with high reliability can be achieved.

When forming the $SiN_x$ film or $SiO_yN_z$ film 9, at the same time when a hydrogen passivation occurs in the electric-field relaxation layer 5, a hydrogen passivation occurs in the avalanche multiplication layer 4 and light-absorbing layer 5. This is because that as the field electric relaxation layer 5 is extremely thin, it is not possible to form the $SiN_x$ film or $SiO_yN_z$ film 9, where a hydrogen passivation occurs, only to the lateral face of the field electric relaxation layer 5. Therefore, as long as the part of hydrogen concentration for either the avalanche multiplication layer 4 or light absorbing layer 5 is not more than 10% of the carrier concentration doped to the electric-field relaxation layer 5, it can be considered that hydrogen concentration not more than 10% of the carrier concentration doped to the electric-field relaxation layer 5 is included in the electric-field relaxation layer 5 at the same time.

Figure 3:
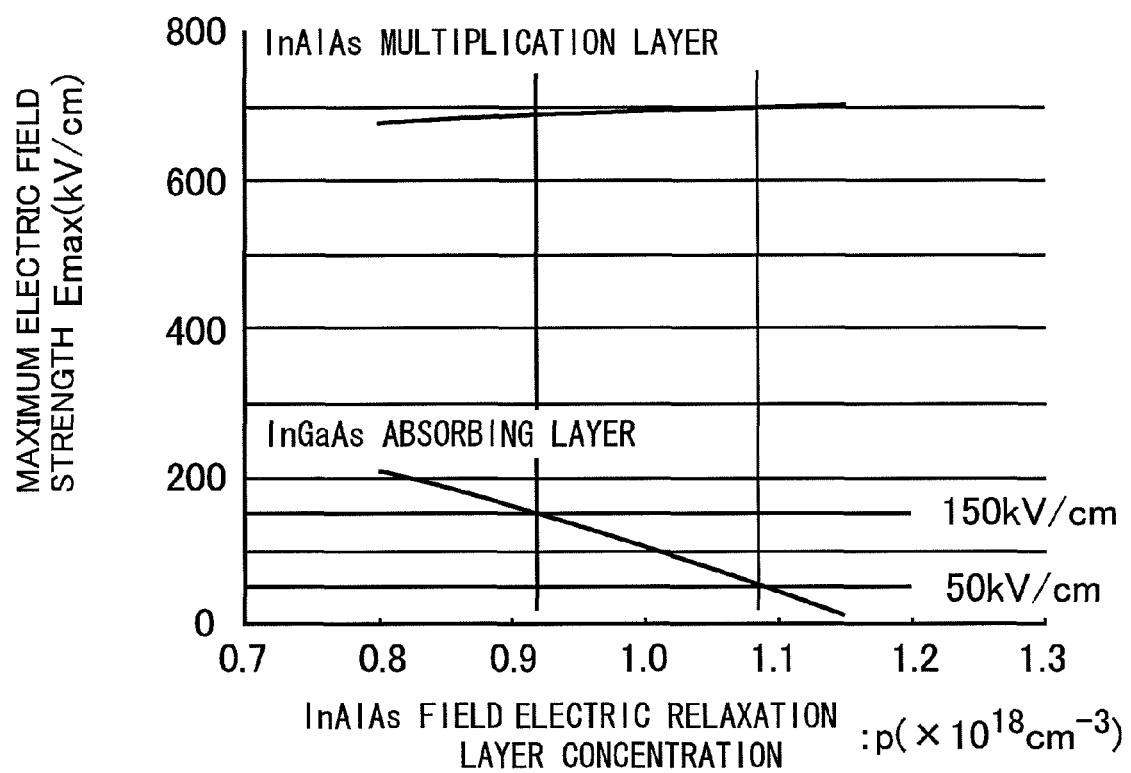
FIG. 3 is a graph showing an electric field strength dependency in a semiconductor light-receiving device.

FIG. 3 is an example of the calculation result of the dependency of the field electric relaxation layer carrier concentration for the electric field strength of the absorption and multiplication layers. For this device, InGaAs is used for the absorbing layer and the carrier concentration is $1\times10^{15}$ cm$^{-3}$ with a thickness of 1.0 μm. Furthermore, for the avalanche multiplication layer, InAlAs is used and the carrier concentration is $1\times10^{15}$ cm$^{-3}$ with a thickness of 0.2 μm. For the electric-field relaxation layer, InAlAs is used with a thickness of 0.04 μm.

In the above composition, an optimum electric field strength in the absorbing layer and avalanche multiplication layer is respectively 50 to 150 kV/cm and 600 kV/cm or more. From FIG. 3, when setting a center of the carrier concentration in the electric-field relaxation layer to $1.0\times10^{18}$, it is acceptable if the amount of change in the carrier concentration is within 15% from the center in order to keep the electric field strength of the absorption or multiplication layer within the range of above optimum value. As the hydrogen radical bonds with an impurity to change the carrier concentration, the carrier concentration may roughly be the one subtracting the hydrogen diffusion amount from the impurity concentration doped to the semiconductor layer. As described above, it is important to suppress the hydrogen concentration not more than 15% of the impurity concentration.

More general conditions are considered. A design range of the multiplication layer electric field of the APD to manufacture is set between 600 to 700 kV/cm. On the other hand, when manufacturing an APD having such multiplication layer electric field, suppose that a manufacture tolerance of the electric field for the light absorbing layer/electric-field relaxation layer interface is from 50 to 150 kV/cm and manufacture variation at a trial production (for example in-plane distribution) is from about 50 to 150 kV/cm. As for the manufacture variation, for example the distribution of wafer in-plane is examined in advance and by determining an area to have a trial production after that, it can be determined beforehand.

Under such trial conditions, for example if the amount of relaxation of the electric-field relaxation layer fluctuates during the process and decreases by 100 kV/cm, it is expected that an electric field of the interface has a distribution of 150 to 250 kV/cm (close to the distribution in reality). As a result, the manufacture variation does not overlap with the manufacture tolerance at all.

At this time, (for the ease of calculation) suppose that real numbers of manufacture variation in interface electric field are distributed with equal density in the variation range, the process manufacture yield can be calculated from the length of overlapped area between the manufacture variation and manufacture tolerance. In the above case, as there is no overlap between the manufacture variation and manufacture tolerance, the process manufacture yield is 0%.

According to such method, in a device with initial multiplication layer electric field strength 600 to 700 kV/cm, when calculating the process manufacture yield if a deviance in the relaxation amount of the electric-field relaxation layer during process is generated for x %, the result shown in table 1 can be obtained.

TABLE 1

| MULTIPLICATION LAYER | x % | | | |
|---|---|---|---|---|
| ELECTRIC FIELD | 5% | 10% | 15% | 18% |
| 600 KV | 77% | 50% | 21% | 0% |
| 700 kV | 72% | 39% | 0% | 0% |

Therefore, as a result of the calculation, if the deviance of the electric-field relaxation layer generated during process can be suppressed to 18% or less, for a device with design multiplication electric field strength 600 kV/cm, a certain number of complete devices can be obtained definitely (if making devices of large enough number). By suppressing the deviance of the electric-field relaxation layer to 15% or less, for a device with design multiplication electric field strength 600 to 700 kV/cm, a certain number of complete devices can be obtained definitely.

By suppressing the deviance in the electric-field relaxation layer to 10% or less, for a device with design electric field strength 600 to 700 kV/cm, it is possible to obtain some complete devices with high probability of at least 39%. Furthermore, in such case, it can be expected that even for a device with the design electric field strength not from 600 to 700 kV/cm, complete devices can be obtained. Moreover, by suppressing the deviance of the electric-field relaxation layer within 5%, for a device with design multiplication electric field strength 600 to 700 kV/cm, complete devices can be obtained with extremely high probability of at least 72%.

In an actual trial production, as there are causes for yield deterioration other than the deviance in the electric-field relaxation layer, in order to obtain complete devices of certain number, it can be considered that the deviance x in the electric-field relaxation layer at a process for the device with design electric field strength 600 to 700 kV/cm must be 15% or less as an essential condition.

This invention has such structural features and also has features in a manufacturing method of the structure. In an example of the manufacturing method of the semiconductor light-receiving device according to this embodiment, $N_2$ or $SiH_4$ and $O_2$ or $N_2O$ which can further suppress the generation of the hydrogen radicals are used instead of $NH_3$ and $SiH_4$ to manufacture the $SiN_x$ or $SiO_yN_z$ film by a plasma CVD for decomposing. As $N_2$ has less decomposition efficiency than $NH_3$, the films are manufactured by ECR (Electron Cyclotron Resonance) method using a high-frequency plasma 60 MHz or 2.4 GHz. By using this method, the amount of generated hydrogen radical is suppressed and thus the effect of hydrogen passivation can be restrained.

Furthermore, another manufacturing method of a semiconductor light-receiving device according to this invention a heat treatment is performed in inert gas atmosphere at 450 degrees Celsius or more and also 470 degrees Celsius or less after manufacturing the $SiN_x$ film or $SiO_yN_z$ film at the surface of the APD using $NH_3$ gas, $SiH_4$ gas and $O_2$ gas or $N_2O$ gas.

Figure 4:
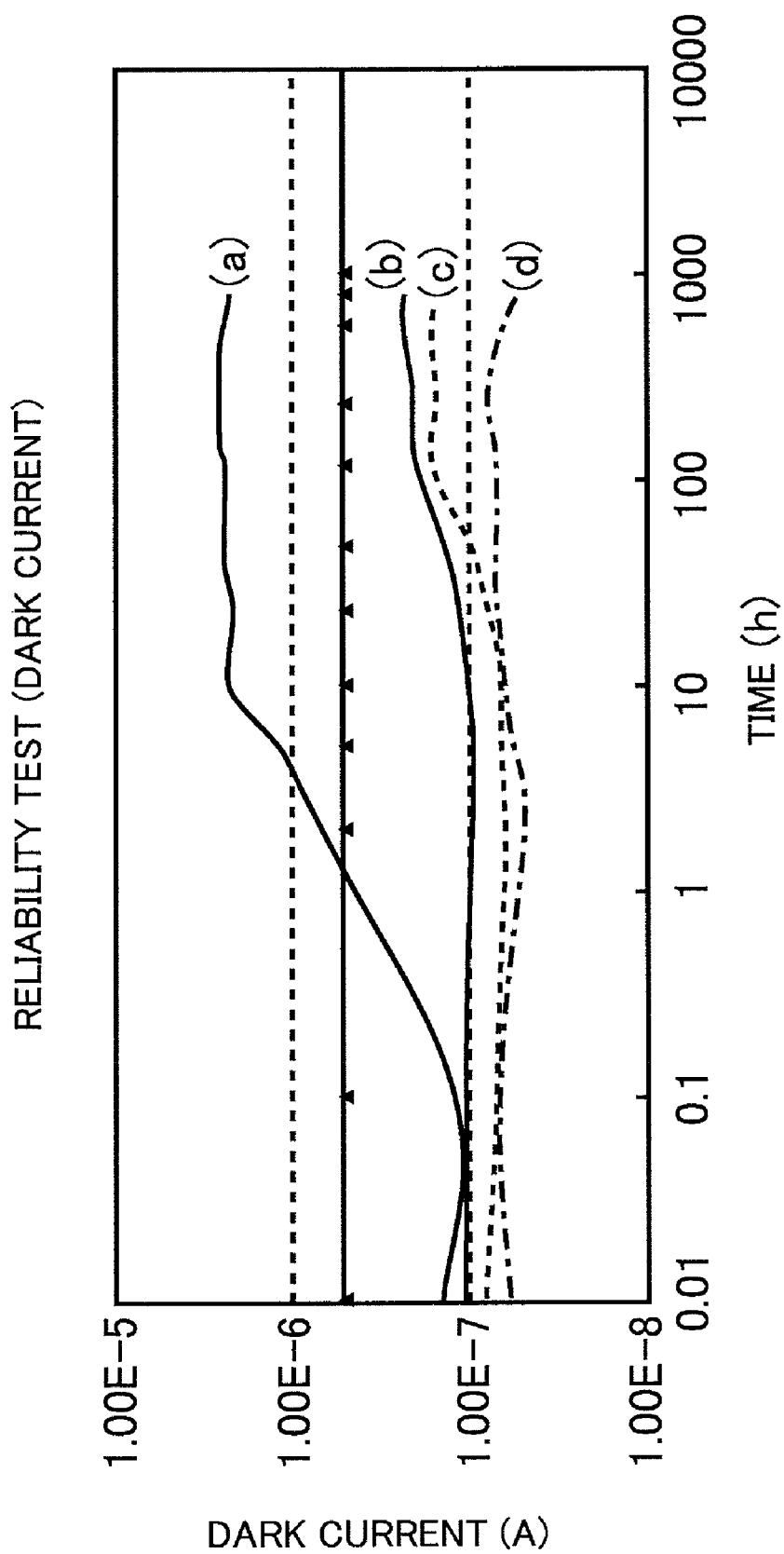
FIG. 4 is a graph showing a result of a reliability evaluation test of the avalanche light-receiving device according to the present invention.

FIG. 4 shows an experimental result of a device reliability of an annealing temperature. In this test, a semiconductor light-receiving device is stored in a state where a reverse bias is applied to the device so that a current of 100 μA flows in 180 degrees $N_2$ atmosphere. Then in the measurement, the semiconductor light-receiving device is put at a room temperature and a dark current is measured in a voltage corresponding to 0.9 times more than a breakdown voltage. As shown in FIG. 4, for (a) sample applied with a heat treatment, (b) sample applied with a heat treatment under $N_2$ atmosphere at 450 degrees Celsius for 10 minutes, (c) sample applied with a heat treatment under $N_2$ atmosphere at 550 degrees Celsius for 10 minutes and (d) sample applied with a heat treatment under $N_2$ atmosphere at 630 degrees Celsius for 10 minutes, the dark current is measured for 1000 hours.

As shown in FIG. 4, for a sample that is annealed for 10 minutes at an annealing temperature from 450 to 630 degrees Celsius, it has not been deteriorated until 1000 hours. In a low-temperature of 450 degrees Celsius or less, the hydrogen radical is not discharged enough from the semiconductor. As for the APD, at a passivation of the $SiN_x$ film or $SiO_yN_z$ film to the lateral face of the electric-field relaxation layer for controlling electric field strength distribution, it is difficult to control the electric field strength distribution because the radical hydrogen that is disjunct from the material of $SiH_4$ gas being diffused and an acceptor is deactivated and the carrier concentration in the electric-field relaxation layer is changed. Moreover, conversely at a high-temperature of 700 degrees Celsius or more, crystallinity of the semiconductor itself is broken up and a film is peeled and broken due to a difference in expansion coefficient of the $SiN_x$ film and a semiconductor or of the $SiO_yN_z$ film and a semiconductor.

As described above, the optimum temperature is in the range from 450 to 700 degrees Celsius. By performing this heat treatment, the hydrogen radical got inside the APD is discharged outside through the passivation film and it is considered that electric field strength of the avalanche multiplication layer, electric-field relaxation layer and light absorbing layer can reach to the required range.

Embodiment 1

A mesa APD 200 and a manufacturing method thereof according to the embodiment 1 of the present invention are described hereinafter with reference to FIG. 5. The semiconductor light-receiving device of the embodiment 1 is a mesa APD. By using a growing apparatus such as GS-MBE (Gas Source-Molecular Beam Epitaxy) apparatus, a laminated structure of the semiconductor layer as shown in FIG. 5 is formed and then an electrode is manufactured.

Figure 5:
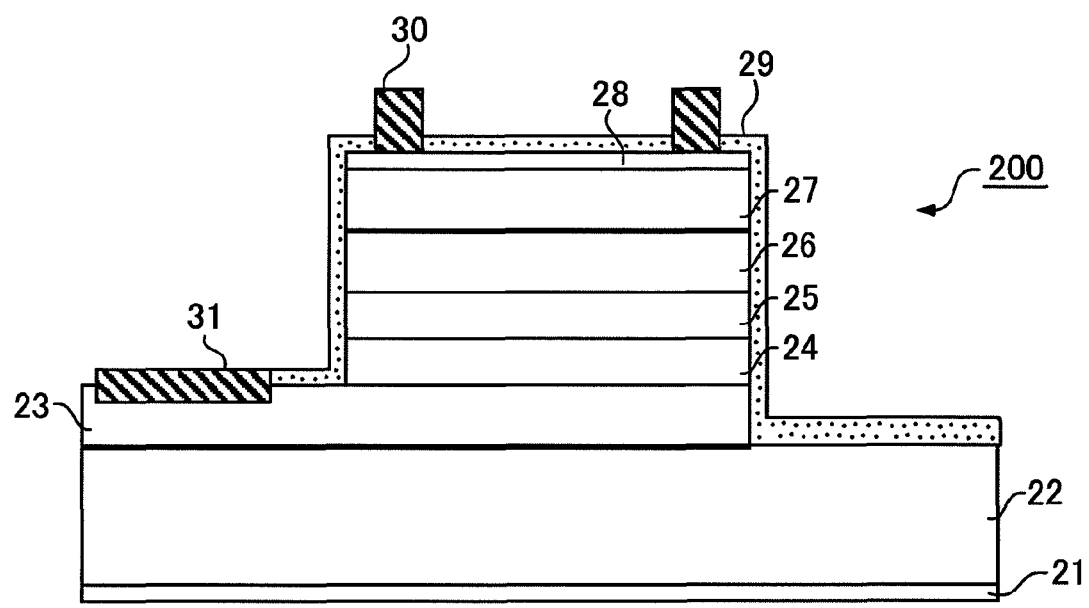
FIG. 5 is a cross-sectional diagram showing the structures of an embodiment 1 and embodiment 2 according to the present invention.

As shown in FIG. 5, an n type InP cladding layer 23 is formed over a semi-insulating InP substrate 22. The n type InP cladding layer 23 is formed by doping Si as an impurity and has a film thickness of 1.0 μm. The n type InP cladding layer 23 functions as an n side contact layer.

The multiplication layer 24 is formed of an undoped InAlAs and has a film thickness of 0.2 μm. The electric-field relaxation layer 25 is formed of a p type InAlAs and has a film thickness of 0.04 μm (carrier concentration $1 \times 10^{18}$ $cm^{-3}$). The absorbing layer 26 is formed of an undoped InGaAs and has a film thickness of 1.0 μm. The cladding layer 27 is formed of a p type InP layer and has a film thickness of 1.0 μm. A p-InP with higher p concentration is formed thereabove.

After that, a mesa structure is formed with a resist as a mask. To form the mesa structure, a wet etching or dry etching is used. After that, as a surface protection film, a $SiN_x$ film or $SiO_yN_z$ film 29 is formed with the thickness of 400 nm. To be more specific, as a source gas, $N_2$ gas or $SiH_4$ gas and $O_2$ gas is used and the source gas is decomposed using a plasma of 60 MHz frequency to form the $SiN_x$ film or $SiO_yN_z$ film 29. After that, a p type electrode 30 and n type electrode 31 are formed.

In order to confirm the effects of this embodiment, as shown in FIG. 2, the $SiN_x$ film or $SiO_yN_z$ film over the semi-insulating InP substrate 22 is peeled to expose the semiconductor surface and surface electric conductivity is examined. The Q portion in FIG. 2 corresponds to conductivity evaluation portion. As a layer with high hydrogen concentration is formed on the surface usually, a trap is passivated and electric conductivity is emerged. However by using the method of this embodiment, the electric conductivity of the substrate can be suppressed.

Furthermore, as another method to confirm the effects, when forming the $SiN_x$ film or $SiO_yN_z$ film by the method of this embodiment, a $SiN_x$ film or $SiO_yN_z$ film is formed over a p type semiconductor substrate (InP and GaAs or the like) at the same time. By removing the $SiN_x$ film or $SiO_yN_z$ film of the semiconductor substrate and evaluating a conductivity type of the semiconductor substrate surface, the effects of this embodiment can be confirmed.

When forming by a conventional plasma CVD method, a passivation for p type dopant impurity is generated by an invasion of hydrogen to the surface, and a phenomenon can be seen in which a conductivity type is reduced. For example when forming a $SiN_x$ film over a semiconductor substrate having a p type concentration of $5 \times 10^{18}$ $cm^{-3}$, suppose that the degree the hydrogen invading to the substrate surface is $2 \times 10^{18}$ $cm^{-3}$ and the passivation rate is 100%, the carrier concentration of the surface is reduced to $3 \times 10^{18}$ $cm^{-3}$. The amount of change at this time is 40% decrease in the carrier concentration. On the other hand when using the method of this embodiment, the change for electric conductivity in top surface can be suppressed to 15% decrease or less.

Figure 6:
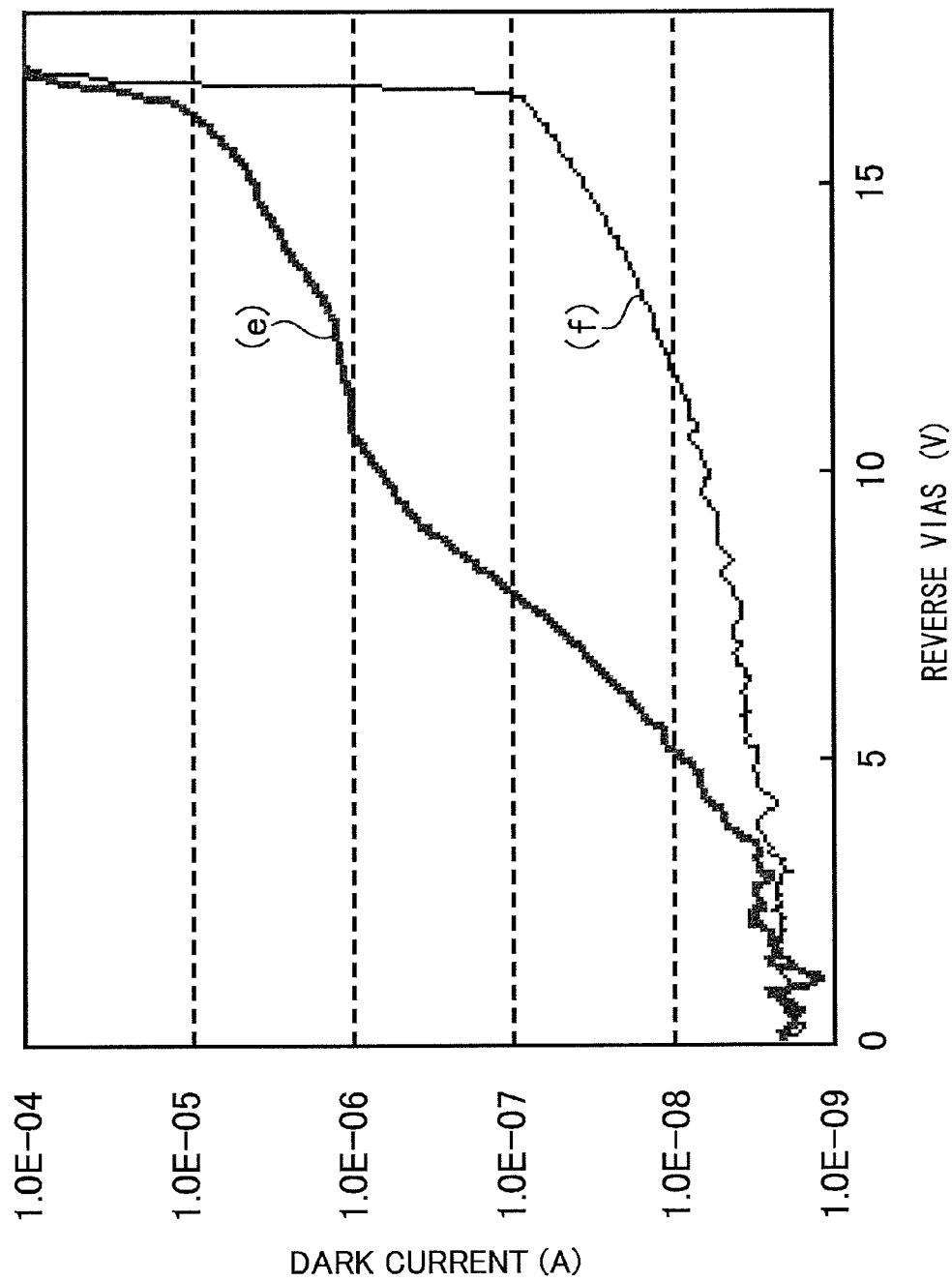
FIG. 6 is a view showing I-V characteristics of the avalanche light-receiving device according to the present invention.

FIG. 6 is I-V characteristics of a device manufactured by the abovementioned manufacturing method of the semiconductor light-receiving device according to the present invention. (e) is a measurement when a 1 μW of light is entered and (f) is a measurement at a condition where light is completely blocked. From the I-V characteristics shown in FIG. 6, at 10V, approx. 1 μA photocurrent flows and when the light is blocked, only a dark current of about hundredth part thereof flows, thus it can be seen that a favorable APD is realized.

Figure 7:
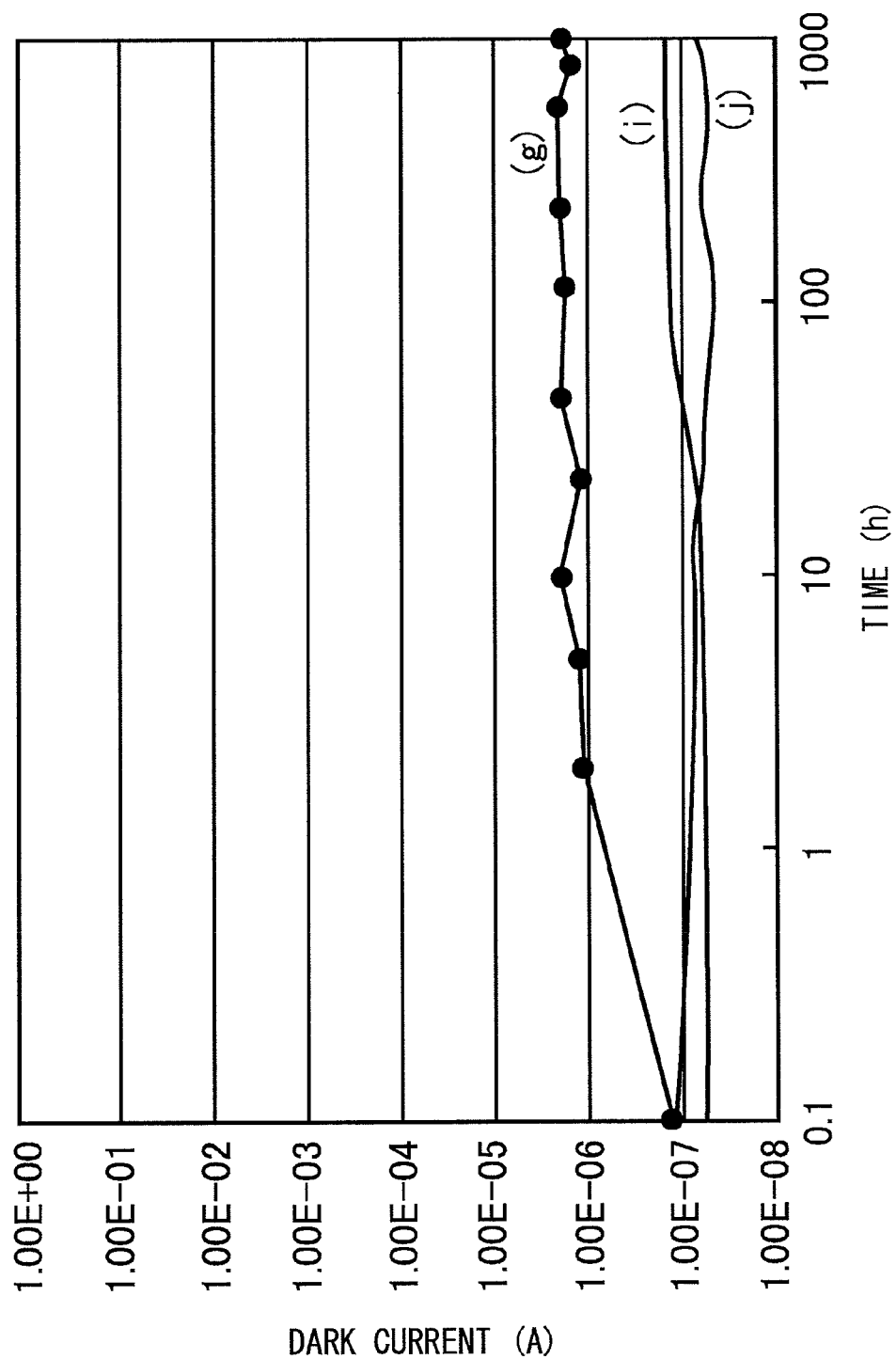
FIG. 7 is a graph showing a time variation of the avalanche light-receiving device according to the present invention.

FIG. 7 is a result of a reliability test by high-temperature acceleration. In this test, a semiconductor light-receiving device is stored in a state where a reverse bias is applied to the device so that a current of 100 μA flows in 180 degrees Celsius $N_2$ atmosphere. Then in the measurement, the semiconductor light-receiving device is put at a room temperature and a dark current is measured in a voltage corresponding to 0.9 times more than a breakdown voltage. (g) is a device that has formed a $SiN_x$ film by a plasma CVD (13 MHz) with $NH_3$ and $SiH_4$ as material. (i) is a device that has formed a $SiN_x$ film by a plasma CVD (60 MHz) with $N_2$ and $SiH_4$ as material. (j) is a device that has formed a $SiN_x$ film by a plasma CVD (60 MHz) with $N_2$ and $SiH_4$ as material and then the $SiN_x$ film is annealed at 550 degrees Celsius for 10 minutes.

The semiconductor light-receiving device of the $SiN_x$ film manufactured by the manufacturing method using $NH_3$ gas is deteriorated in a few hours, while the time variation in the dark current value concerning the semiconductor light-receiving device manufactured using $N_2$ gas as a nitrogen source is suppressed. Moreover, for the semiconductor light-receiving device created using $N_2$ gas as a nitrogen source, it can be seen that the time variation in the dark current value is further suppressed by annealing at 550 degrees Celsius. This is an effect of using $N_2$ gas instead of $NH_3$ gas. To form $SiO_yN_z$ film, $O_2$ gas must be added as a material, however it does not especially influence the amount of hydrogen generation, thus the same characteristics can be achieved even for the $SiO_yN_z$ film.

Embodiment 2

In a semiconductor light-receiving device according to an embodiment 2, hydrogen from the electric-field relaxation layer is removed by a heat treatment. The structure is same as the embodiment 1.

As shown in FIG. 5, the n type InP cladding layer 23 is formed over the InP substrate 22. The n type InP cladding layer 23 is formed by doping Si as an impurity and has a film thickness of 1.0 μm. The n type InP cladding layer 23 functions as an n side contact layer.

The multiplication layer 24 is formed from an undoped InAlAs and has a film thickness of 0.2 μm. The electric-field relaxation layer 25 is formed from a p type InAlAs and has a film thickness of 0.04 μm (carrier concentration $1\times10^{18}$ $cm^{-3}$). The absorbing layer 26 is formed from an undoped InGaAs and has a film thickness of 1.0 μm. The cladding layer 27 is formed from a p type InP layer and has a film thickness of 1.0 μm. A P type contact layer 28 is formed from a p type InP layer and has a film thickness of 0.1 μm.

After that, a mesa structure is formed with a resist as a mask. To form the mesa structure, an etchant of HBr or $H_2O_2$ etc. is used. After that, as a surface protection film, a $SiN_x$ film or $SiO_yN_z$ film 29 is formed for the thickness of 400 nm with $NH_3$ and $SiH_4$ as material. In this process, hydrogen diffuses into the electric-field relaxation layer 25 and reduces an activation rate of Be, which is an acceptor impurity. This influence causes to increase field electric strength of the absorbing layer 26 and effects to increase a dark current and reliability for the APD 200.

In this embodiment, in order to reduce this influence, a heat treatment is performed in a nitrogen atmosphere. The heat treatment kept 500 degrees Celsius under $N_2$ atmosphere for 10 minutes. After that, a p electrode 30 and n electrode 31 are formed respectively to p and n sides. The p electrode 30 is formed over the p type InP contact layer 28 and n electrode 31 is formed over the n type InP cladding layer 23. After that, a high-temperature acceleration test is performed in the same method as in the embodiment 1.

Figure 8:
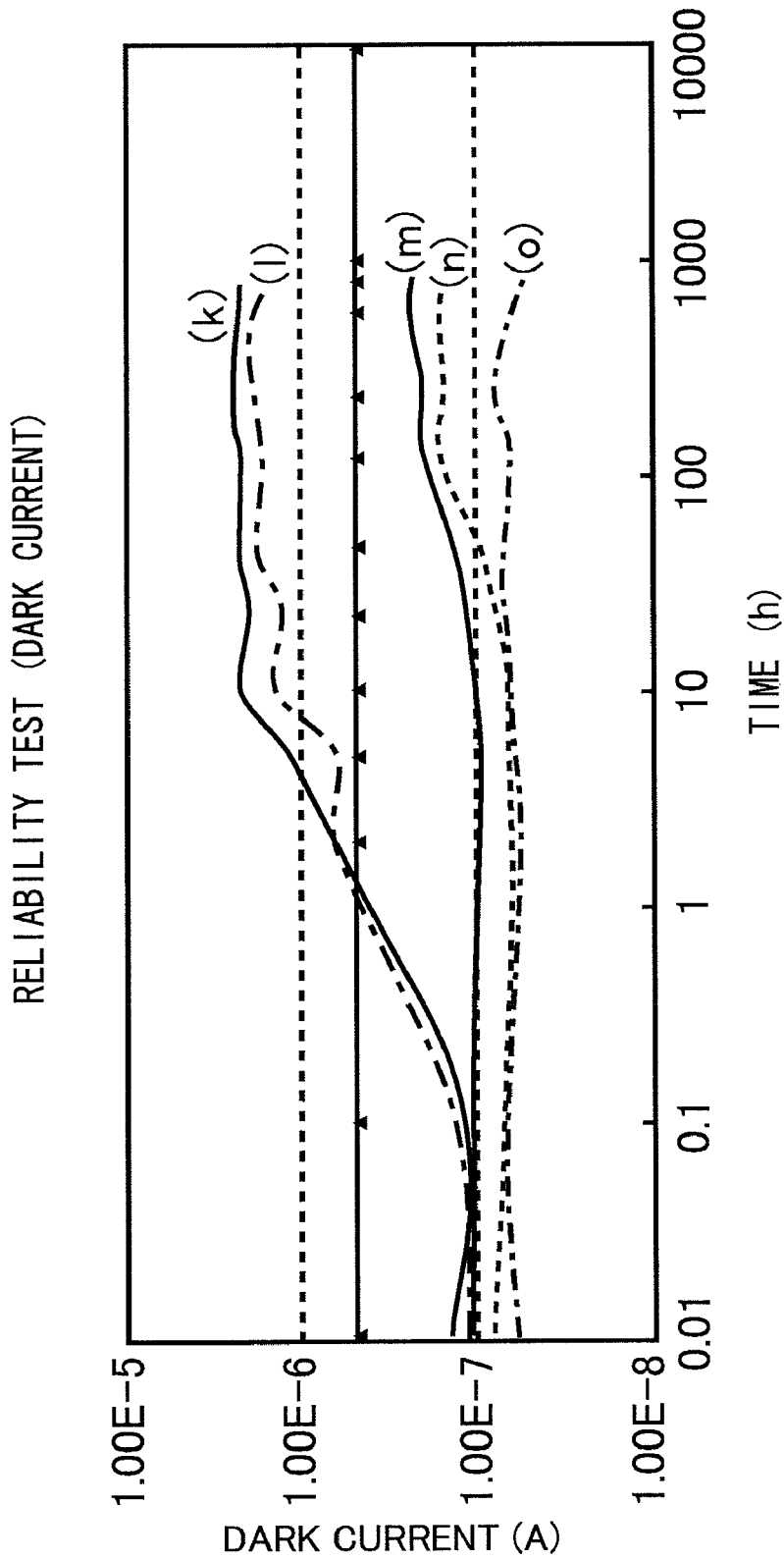
FIG. 8 is a graph showing a result of a reliability evaluation test according to the embodiment 2 of the present invention.

FIG. 8 shows a test result. (k) is a device not heat treated, (l) to (o) are annealed for 10 minutes and their annealing temperatures are respectively (l) 400 degrees Celsius, (m) 450 degrees Celsius, (n) 630 degrees Celsius and (o) 550 degrees Celsius. As for the sample annealed at 400 degrees Celsius, there is no effect and deterioration is generated soon. However for the sample annealed at 450 degrees Celsius or more, an improvement in reliability by the annealing was confirmed.

Embodiment 3

Figure 9:
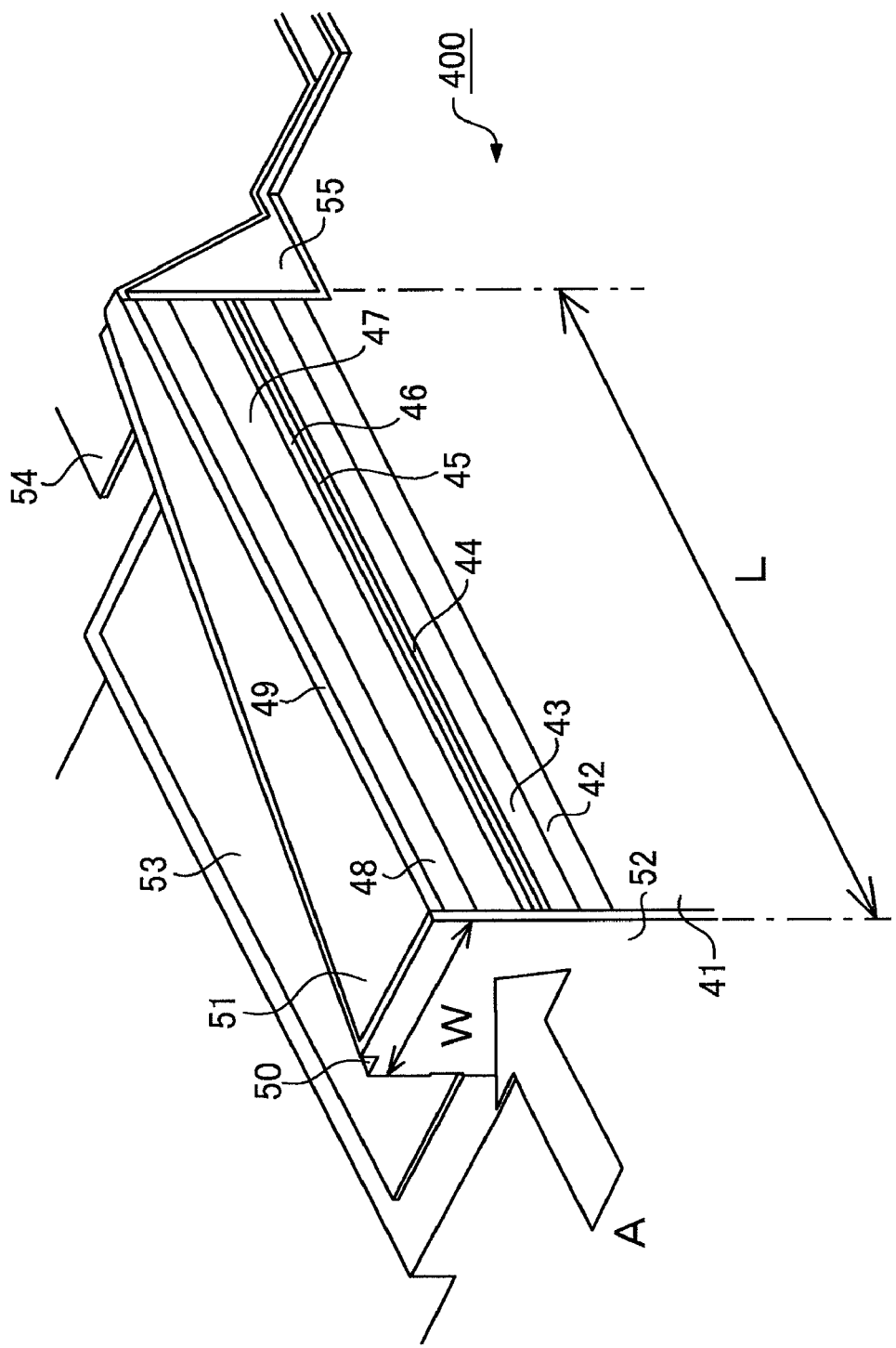
FIG. 9 is a perspective view showing a waveguiding structure of an embodiment 3 of the present invention.
Figure 10:
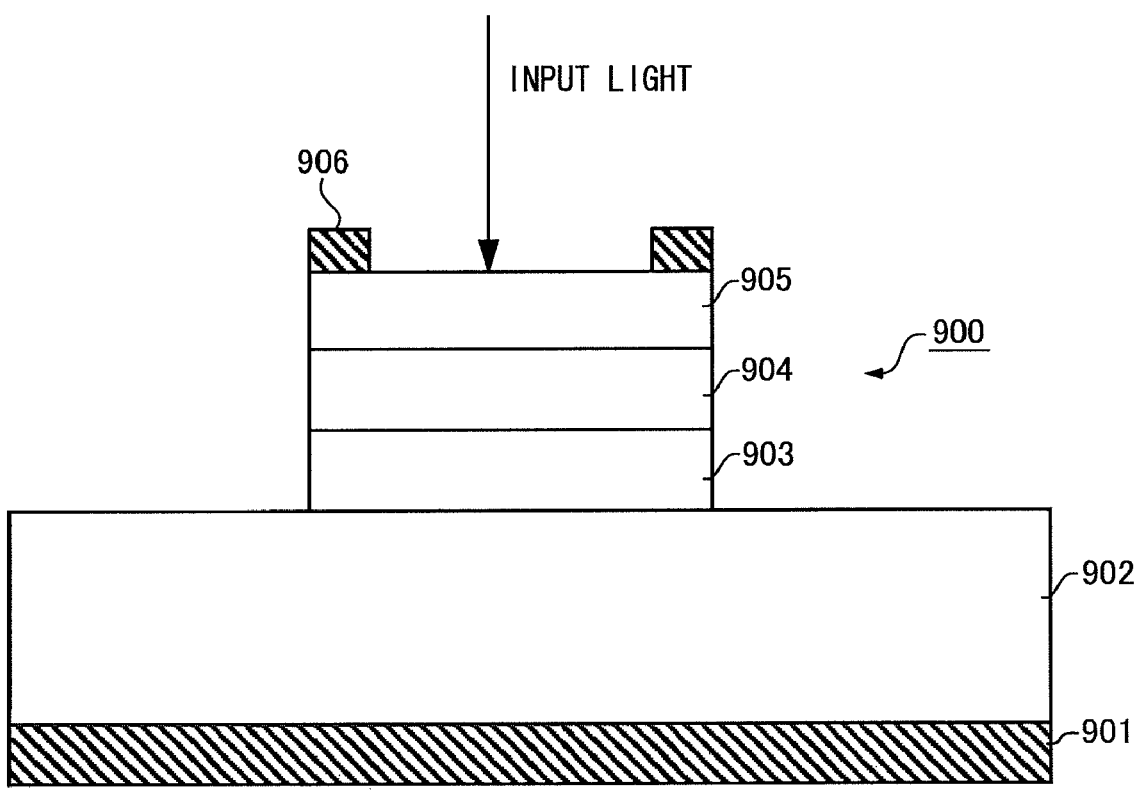
FIG. 10 is a cross-sectional diagram showing the structure of a conventional semiconductor light-receiving device.
Figure 11:
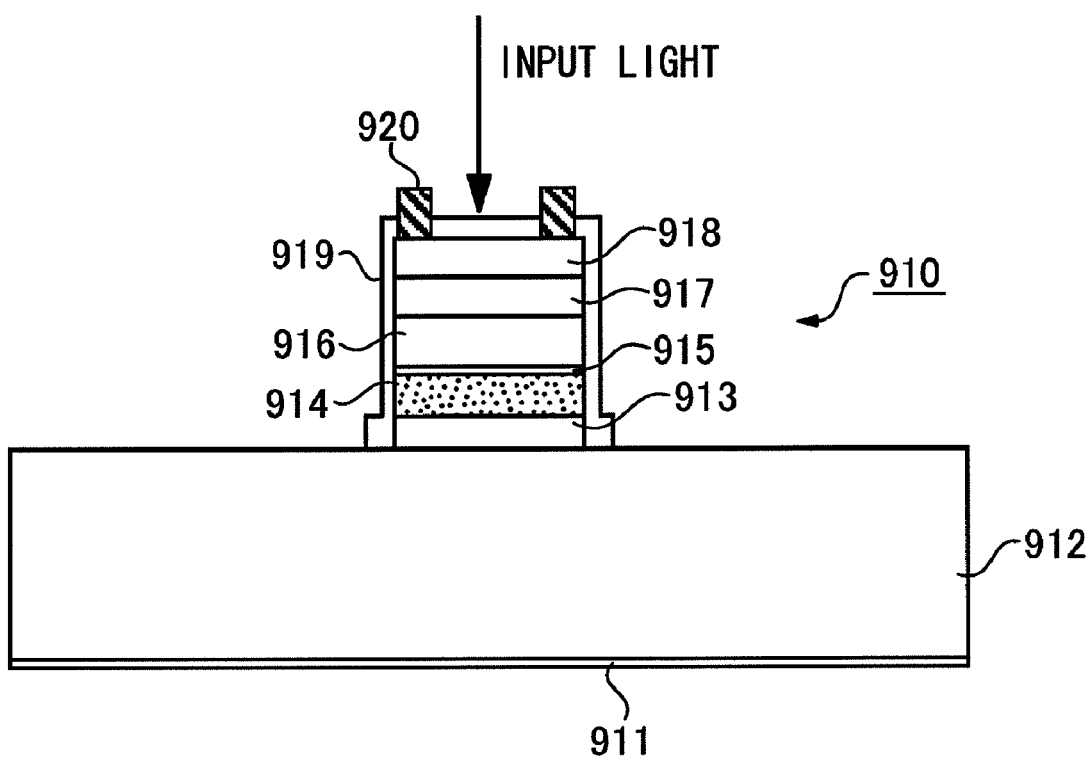
FIG. 11 is a cross-sectional diagram showing the structure of a conventional avalanche light-receiving device.
Figure 12:
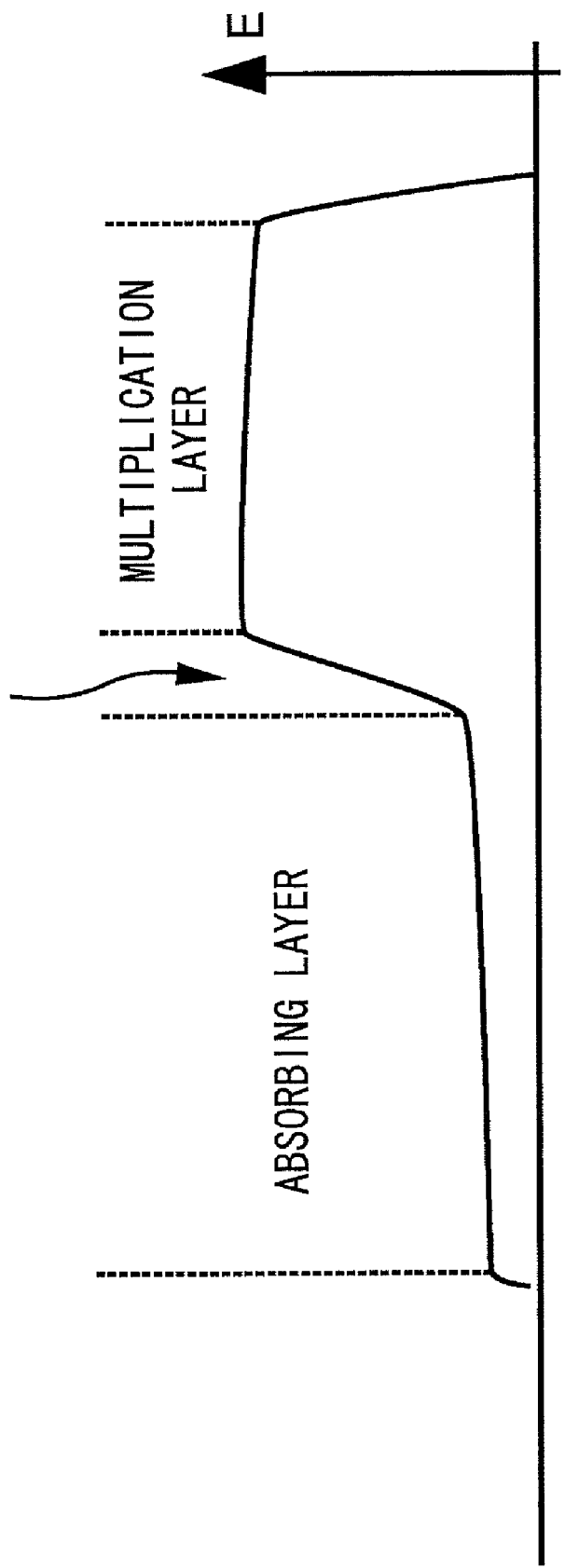
FIG. 12 is a view showing an internal electric field of an avalanche light-receiving device.

The high reliability achieving method of this invention can be applied to a waveguide structure, which is an edge face incident type. FIG. 9 shows a schematic diagram of a waveguide type device 400. Layers are laminated in the following order over a Fe-InP substrate 41. An n type InP buffer layer 42 for obtaining an n electrode, 0.5 μm of an n type InGaAsP guide layer 43 with composition wavelength 1.2 μm, 0.2 μm of InAlAs multiplication layer 44, 0.2 μm of InAlAs electric-field relaxation layer 45, 0.5 μm of InGaAs absorbing layer 46, 0.5 μm of p type InGaAsP guide layer 47 with composition wavelength 1.2 μm, 1.0 μm of p type InP cladding layer 48 and 0.2 μm of p type InGaAs contact layer 49 are consecutively grown and formed.

After that, a light-receiving unit area is remained and the portion for forming the n electrode is etched to the n type InP buffer layer 42 and other portions are etched to the substrate 41. The mesa structure's width W is 10 μm on the incident side, 5 μm on the backend side and a waveguide length L is 50 μm. After that, a $SiN_x$ protection film 50 is formed with $N_2$ and $SiH_4$ as source gas and an edge face is manufactured by opening wall. Likewise to the edge face, an edge face protection film is formed by the method indicated in this invention with $N_2$ and $SiH_4$ gas. After that, a p electrode 51, antireflective film 52, n electrode 53, p type pad electrode 54 and bump relaxation polyimide layer 55 are formed. In this structure, an incident light enters from the A portion shown in FIG. 7 and absorbed while guiding wave in the absorbing layer. A high quantum efficiency can be achieved even with a thin absorbing layer and it is possible to reduce carrier transit time in the absorbing layer. As the protection film uses the method described in this embodiment, a high reliability can be achieved.

Furthermore, a deactivation of the impurity due to the diffusion of hydrogen atom into a semiconductor is also generated for an n type impurity. Thus this embodiment is also effective to an APD constituted of a positive hole injection type InP multiplication layer and InGaAs absorbing layer.

It is apparent that the present invention is not limited to the above embodiments but it may be modified and changed without departing from the scope and spirit of the invention. Moreover in this embodiment, a light-receiving device constituted from III-V group semiconductor is taken as an example, however this embodiment is not limited to the light-receiving device constituted from III-V group semiconductor but is effective to a light-receiving device constituted from II-VI group semiconductor such as GaN or ZnCdSe system or IV group semiconductor such as Si system.

The invention claimed is:

1. A manufacture method of a mesa semiconductor light-receiving device including a light absorbing layer, an avalanche multiplication layer and an electric-field relaxation layer over a semiconductor substrate, the method comprising:
    forming a mesa semiconductor structure;
    forming a $SiN_x$ film or a $SiO_yN_z$ film using at least $N_2$ gas as a nitrogen source to a lateral face of the mesa semiconductor structure; and
    performing a heat treatment in inert gas atmosphere at 450 degrees Celsius or more and 700 degrees Celsius or less.

2. The manufacture method of a semiconductor light-receiving device according to claim 1, wherein the $SiN_x$ film is formed using $SiH_4$ gas in addition to $N_2$ gas and the $SiO_yN_z$ film is formed using $O_2$ gas or $N_2O$ gas in addition to $N_2$ gas and $SiH_4$ gas.

3. A manufacture method of a mesa semiconductor light-receiving device including a light absorbing layer, an avalanche multiplication layer and an electric-field relaxation layer over a semiconductor substrate, the method comprising:
    forming a mesa semiconductor structure; and
    forming a $SiN_x$ film or a $SiO_yN_z$ film using at least $N_2$ gas as a nitrogen source to a lateral face of the mesa semiconductor structure, wherein the $SiN_x$ film or the $SiO_yN_z$ film is manufactured by an ECR (Electron Cyclotron Resonance) method.

4. The manufacture method of a semiconductor light-receiving device according to claim 2, wherein the $SiN_x$ film or the $SiO_yN_z$ film is manufactured by an ECR (Electron Cyclotron Resonance) method.

5. A manufacturing method of a mesa semiconductor light-receiving device including a light absorbing layer, an avalanche multiplication layer and an electric-field relaxation layer over a semiconductor substrate, the method comprising:
    forming a mesa semiconductor structure;
    forming a $SiN_x$ film or a $SiO_yN_z$ film to a side wall surface of the mesa semiconductor structure; and
    performing a heat treatment in inert gas atmosphere at 450 degrees Celsius or more and 700 degrees Celsius or less.

6. The manufacturing method of the semiconductor light-receiving device according to claim 5, wherein the $SiN_x$ film is formed using $N_2$ gas or $NH_3$ gas and $SiH_4$ gas and the $SiO_yN_z$ film is formed using $N_2$ gas and $SiH_4$ gas and $O_2$ gas.

7. A manufacture method of a mesa semiconductor light-receiving device, the method comprising:
    forming a mesa semiconductor structure on a semiconductor substrate, the mesa semiconductor structure including an avalanche multiplication layer, a electric-field relaxation layer, an absorbing layer, a cladding layer, and a contact layer are formed in this order from bottom;
    forming a $SiN_x$ film or a $SiO_yN_z$ film using at least $N_2$ gas as a nitrogen source of a plasma CVD (Chemical Vapor Deposition) to a lateral face of the mesa semiconductor structure; and
    performing a heat treatment in inert gas atmosphere at 450 degrees Celsius or more and 700 degrees Celsius or less.

8. The manufacture method of a semiconductor light-receiving device according to claim 7, wherein the absorbing layer is made of InGaAs.

9. The manufacture method of a semiconductor light-receiving device according to claim 7, wherein the avalanche multiplication layer is made of InAlAs.

10. The manufacture method of a semiconductor light-receiving device according to claim 7, wherein the electric-field relaxation layer is made of InAlAs.

11. The manufacture method of a semiconductor light-receiving device according to claim 7, wherein an optimum electric field strength in the absorbing layer is 50 to 150kV/cm.

12. The manufacture method of a semiconductor light-receiving device according to claim 7, wherein an optimum electric field strength in the avalanche multiplication layer is 600kV/cm or more.

13. The manufacture method of a semiconductor light-receiving device according to claim 7, wherein the $SiN_x$ film or the $SiO_yN_z$ film is formed both on the lateral face of the mesa semiconductor structure and on the semiconductor substrate at the same time.

* * * * *